US006448106B1

(12) United States Patent
Wang et al.

(10) Patent No.: US 6,448,106 B1
(45) Date of Patent: Sep. 10, 2002

(54) MODULES WITH PINS AND METHODS FOR MAKING MODULES WITH PINS

(75) Inventors: Wen-chou Vincent Wang, Cupertino; Thomas J. Massingill, Scotts Valley; Yasuhito Takahashi; Lei Zhang, both of San Jose, all of CA (US)

(73) Assignee: Fujitsu Limited (JP)

( * ) Notice: Subject to any disclaimer, the term of this patent is extended or adjusted under 35 U.S.C. 154(b) by 0 days.

(21) Appl. No.: 09/437,736

(22) Filed: Nov. 9, 1999

(51) Int. Cl.[7] ............................................... H01L 21/44
(52) U.S. Cl. ...................................... 438/106; 438/108
(58) Field of Search ................................ 438/106, 108, 438/118, 121, 125

(56) References Cited

U.S. PATENT DOCUMENTS

| | | | |
|---|---|---|---|
| 4,231,154 A | 11/1980 | Gazdik et al. ................. 29/840 |
| 4,418,857 A | * 12/1983 | Ainslie et al. ............... 257/723 |
| 4,514,752 A | * 4/1985 | Engel et al. .................... 357/72 |
| 4,517,021 A | 5/1985 | Gazdik et al. ............... 156/644 |
| 4,616,406 A | * 10/1986 | Brown .......................... 29/588 |
| 4,618,739 A | 10/1986 | Theobald ................. 174/52 FP |
| 4,742,024 A | * 5/1988 | Sugimoto et al. ........... 437/211 |
| 4,791,075 A | * 12/1988 | Lin ............................ 437/209 |
| 4,812,191 A | 3/1989 | Ho et al. .................... 156/239 |
| 4,861,944 A | 8/1989 | Jones, II et al. ........... 174/68.5 |
| 4,874,721 A | * 10/1989 | Kimura et al. .............. 437/209 |
| 4,924,033 A | 5/1990 | Iyogi et al. ................. 174/259 |
| 4,965,227 A | 10/1990 | Chang et al. ................ 437/207 |
| 4,970,577 A | 11/1990 | Ogihara et al. ................ 357/74 |
| 4,970,781 A | 11/1990 | Chang et al. ................. 29/843 |
| 5,008,770 A | 4/1991 | Hilland ......................... 361/56 |
| 5,098,864 A | * 3/1992 | Mahulikar .................. 437/221 |
| 5,102,829 A | * 4/1992 | Cohn .......................... 437/217 |
| 5,126,818 A | * 6/1992 | Takami et al. ................. 357/68 |
| 5,268,065 A | 12/1993 | Grupen-Shemansky ..... 156/630 |
| 5,337,219 A | 8/1994 | Carr et al. ................... 361/794 |
| 5,362,985 A | 11/1994 | Ma et al. ..................... 257/707 |
| 5,447,871 A | 9/1995 | Goldstein ..................... 437/14 |
| 5,468,995 A | 11/1995 | Higgins, III ................ 257/697 |
| 5,485,039 A | 1/1996 | Fujita et al. ................. 257/774 |
| 5,534,094 A | 7/1996 | Arjavalingam et al. ...... 156/155 |
| 5,574,311 A | 11/1996 | Matsuda ...................... 257/697 |
| 5,614,277 A | 3/1997 | Beilstein, Jr. et al. ..... 428/40.1 |
| 5,627,405 A | 5/1997 | Chillara ....................... 257/668 |
| 5,653,019 A | * 8/1997 | Bernhardt et al. ............. 29/840 |
| 5,715,595 A | * 2/1998 | Kman et al. .................... 29/845 |
| 5,726,493 A | * 3/1998 | Yamashita et al. .......... 257/698 |
| 5,734,555 A | * 3/1998 | McMahon ................... 361/704 |
| 5,743,009 A | * 4/1998 | Matsui et al. .................. 29/843 |
| 5,777,852 A | * 7/1998 | Bell ............................ 361/769 |
| 5,786,239 A | * 7/1998 | Ohsawa et al. .............. 438/123 |
| 5,786,628 A | * 7/1998 | Beilstein, Jr. et al. ...... 257/684 |
| 5,786,630 A | * 7/1998 | Bhansali et al. ............. 257/697 |
| 5,796,164 A | * 8/1998 | McGraw et al. ............. 257/723 |
| 5,818,697 A | * 10/1998 | Armezzani et al. ......... 361/749 |
| 5,821,626 A | * 10/1998 | Ouchi et al. ................. 257/778 |
| 5,840,593 A | * 11/1998 | Leedy ............................ 438/6 |
| 5,841,190 A | * 11/1998 | Noda et al. .................. 257/678 |
| 5,900,312 A | * 5/1999 | Sylvetser .................. 428/322.7 |
| 5,919,329 A | * 7/1999 | Banks et al. ................. 156/281 |
| 6,125,529 A | * 10/2000 | Rosen et al. ................... 29/612 |

OTHER PUBLICATIONS

An Introduction to Plastic Pin Grid Array (PPGA) Packaging, *Intel AP–577 Application Note* (Jun. 1997), 26 pps.*
Tummala, *Microelectronics Packaging Handbook*: "Pinned Packages" (pps. 782–803); "Consumer Product through Mid–Range Computer Packaging" (pps. 1082–1085) (1989).*

* cited by examiner

Primary Examiner—Michael Sherry
Assistant Examiner—Scott Geyer
(74) Attorney, Agent, or Firm—Coudert Brothers LLP

(57) ABSTRACT

Device modules with pins and methods for making device modules with pins are disclosed. One embodiment is directed to a method including forming a polymeric circuit structure having a first side and a second side on a substrate. The formed first side is adjacent to the substrate. A pin is bonded to the second side of the polymeric circuit structure. At least a portion of the substrate is removed to expose at least a portion of the first side of the polymeric circuit structure, and a device is mounted on the first side of the polymeric circuit structure.

16 Claims, 8 Drawing Sheets

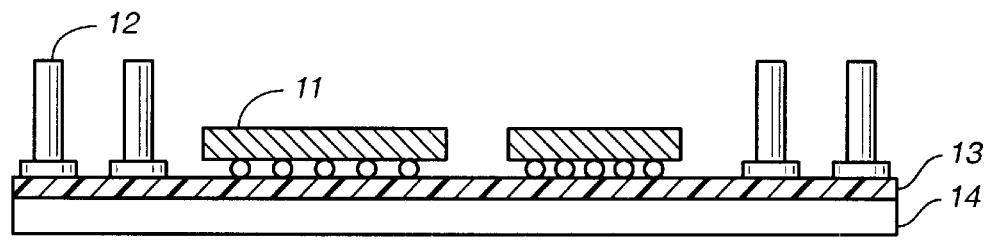
FIG._1a
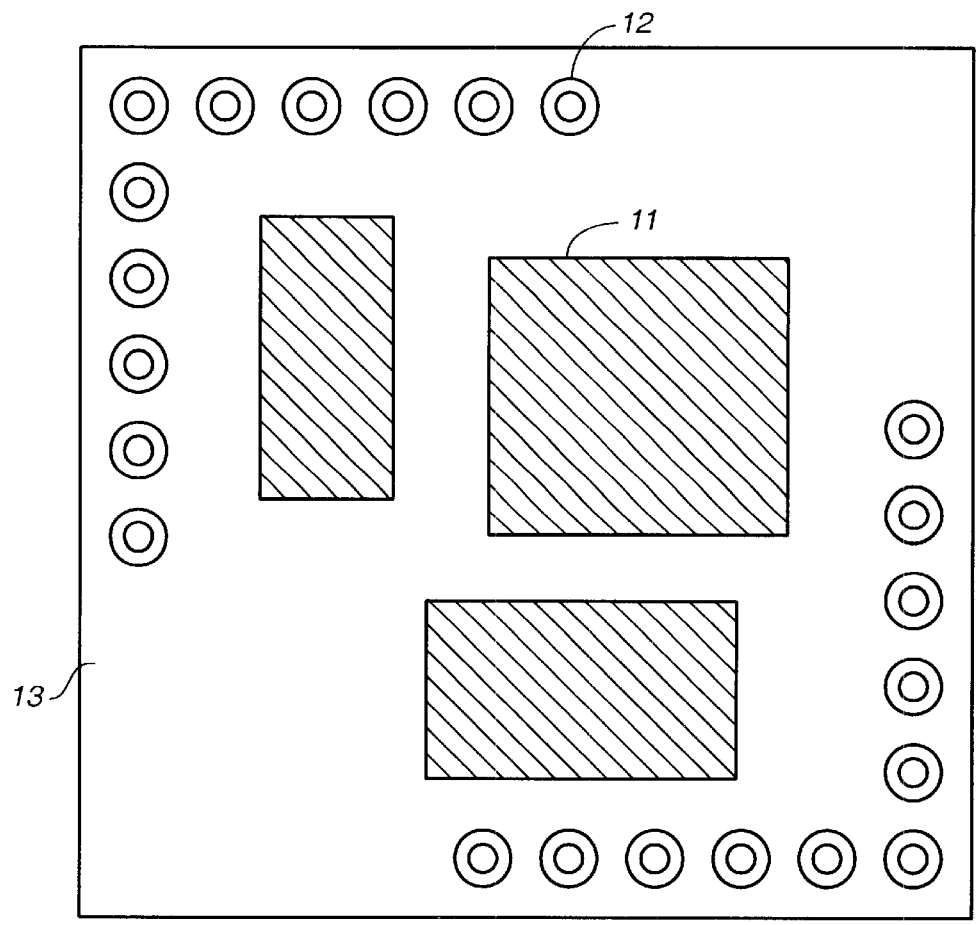
FIG._1b

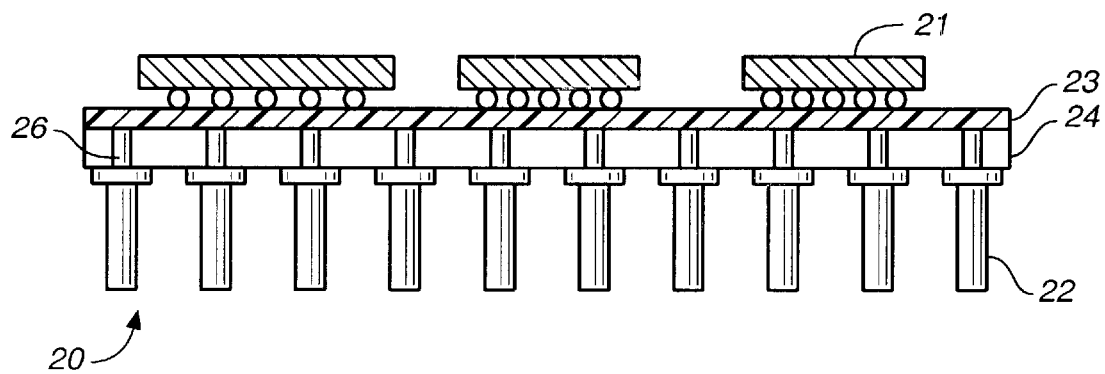
FIG._2a
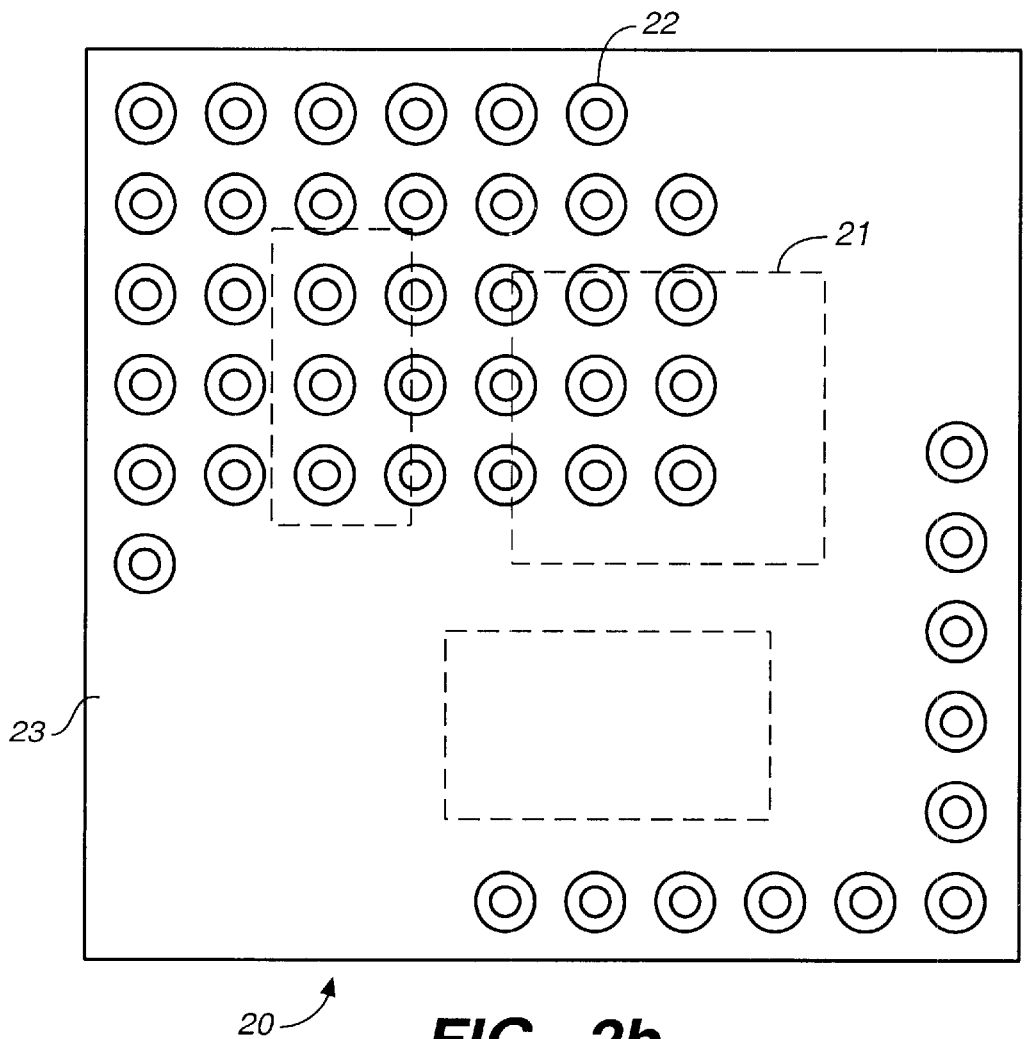
FIG._2b

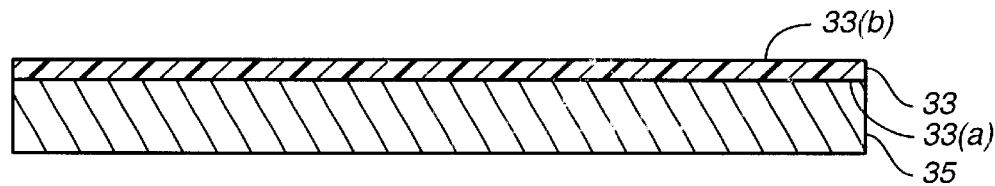
FIG._3a
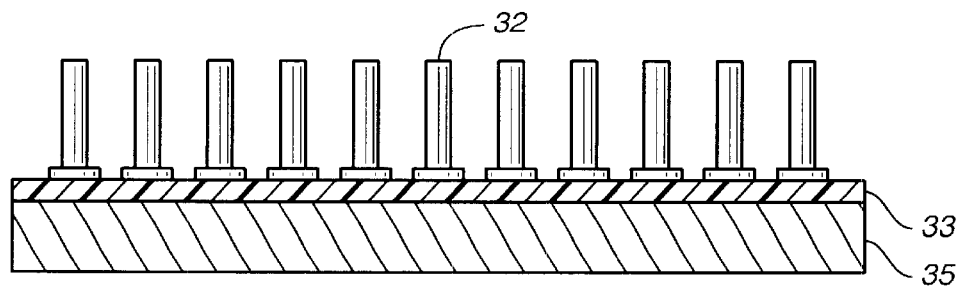
FIG._3b
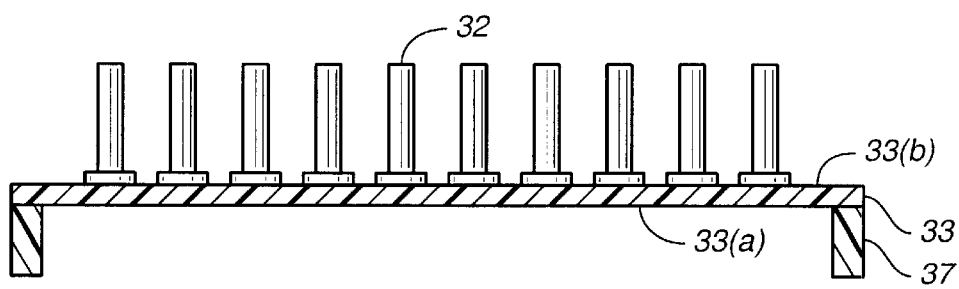
FIG._3c
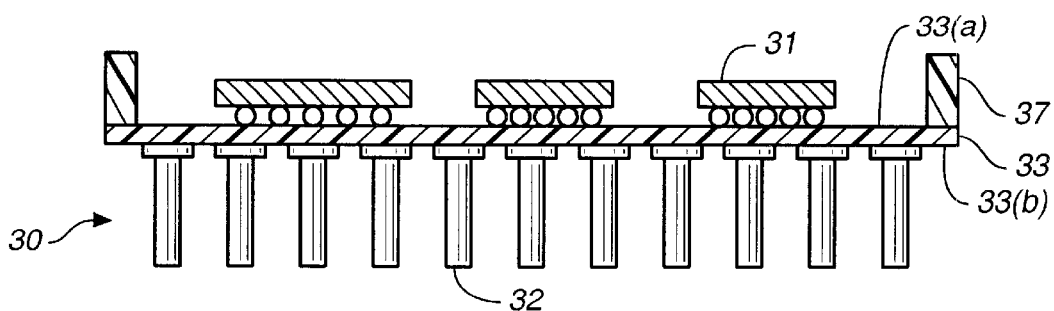
FIG._3d

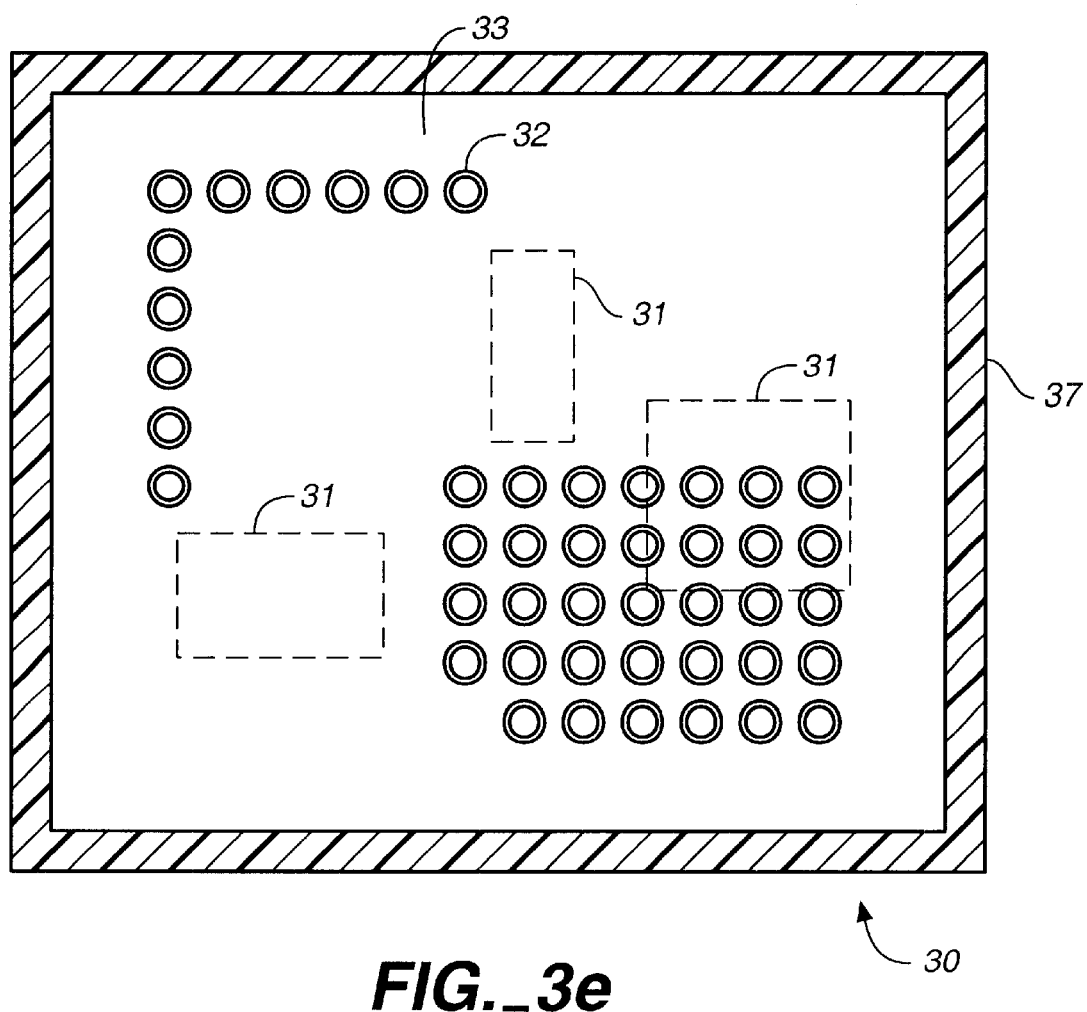
FIG._3e

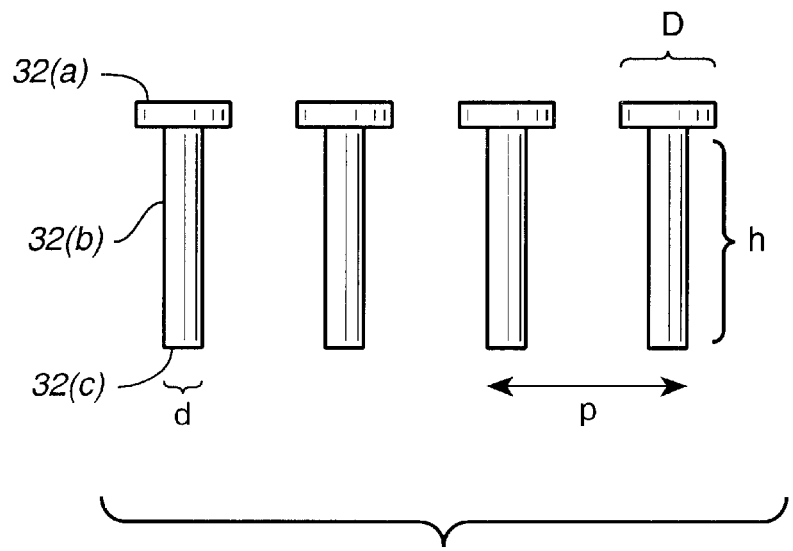
FIG._4a
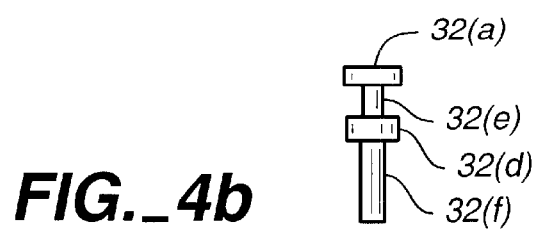
FIG._4b
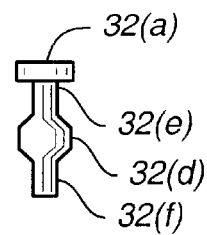
FIG._4c
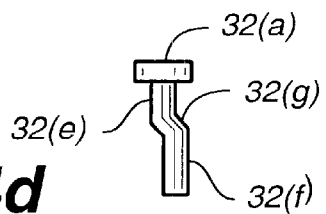
FIG._4d

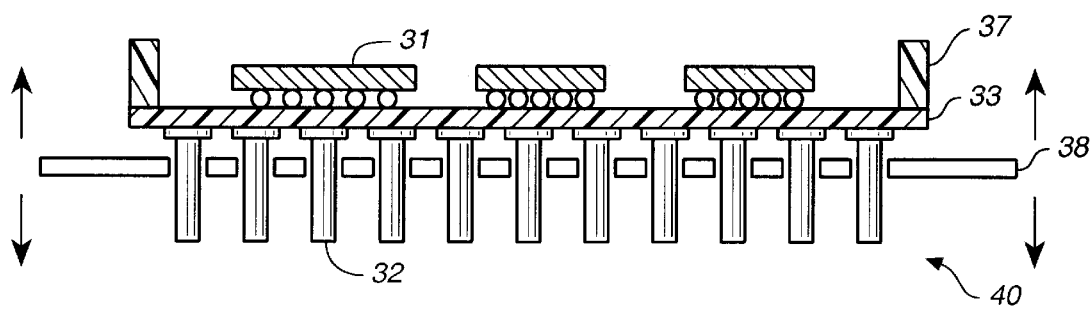
FIG._5a
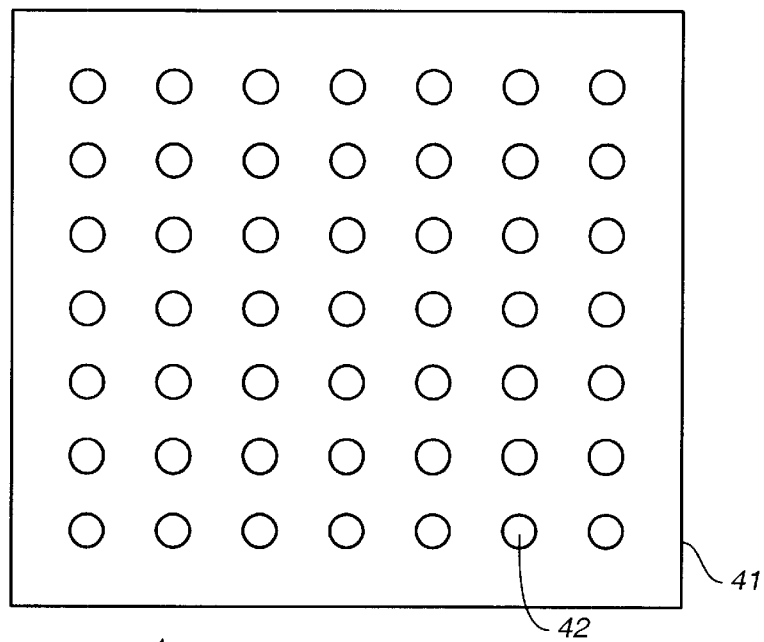
FIG._5b

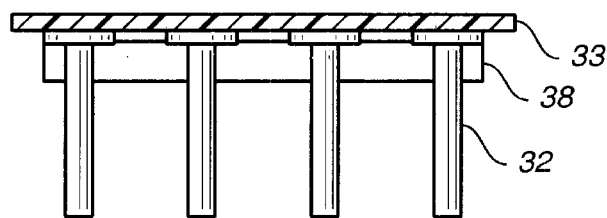
FIG._5c
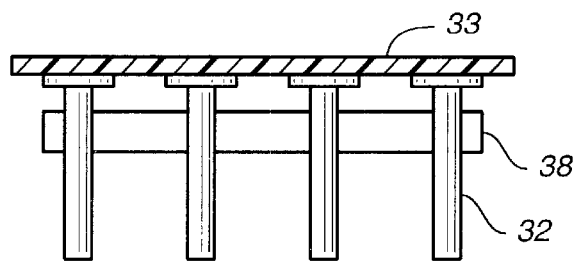
FIG._5d
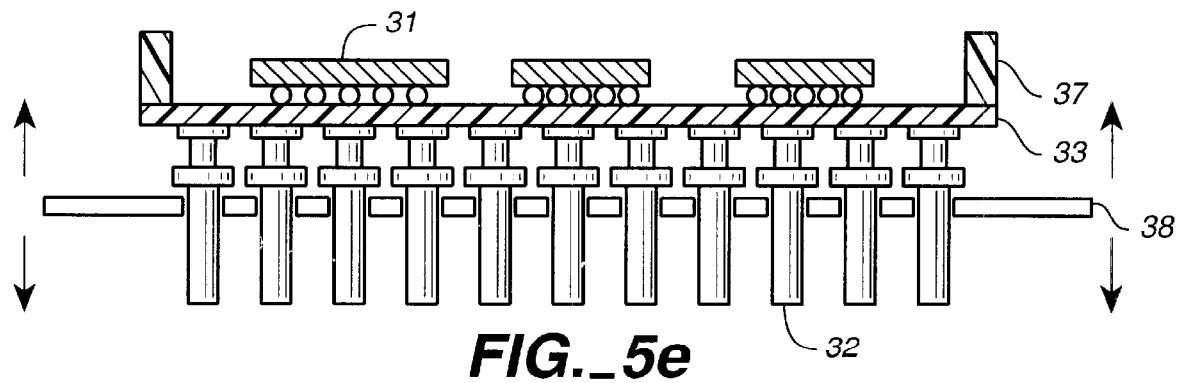
FIG._5e

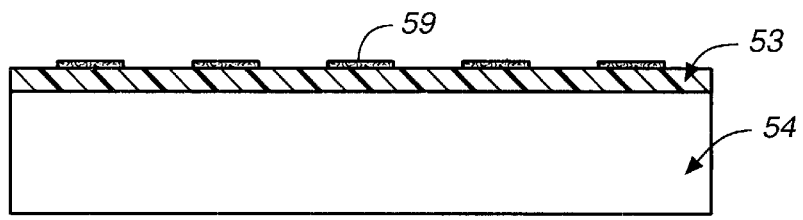
FIG._6a
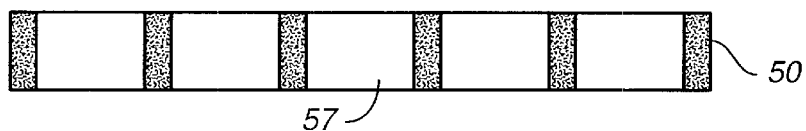
FIG._6b
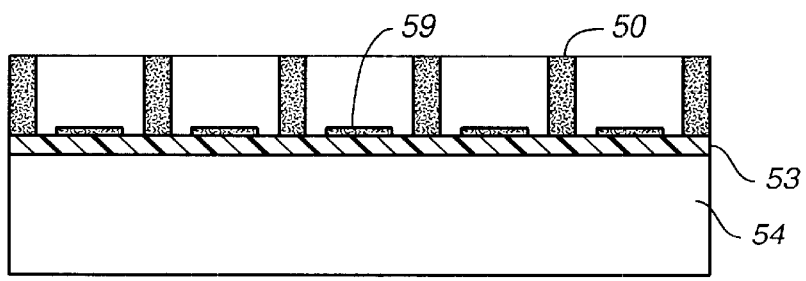
FIG._6c
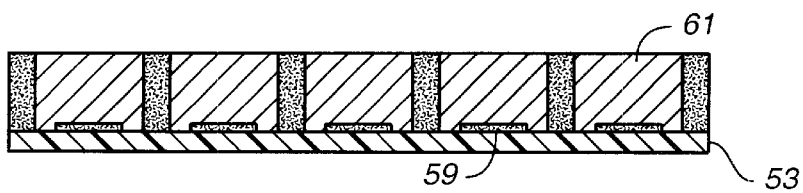
FIG._6d
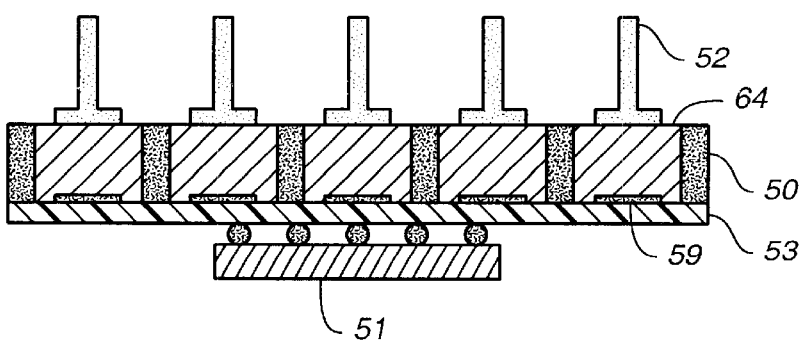
FIG._6e

MODULES WITH PINS AND METHODS FOR MAKING MODULES WITH PINS

FIELD OF THE INVENTION

Embodiments of the invention relate to device modules and methods for making device modules.

BACKGROUND OF THE INVENTION

A computer such as a server or supercomputer normally includes a number of devices such as integrated circuit chips. The way that such devices are packaged can determine how efficiently the computer can operate. For example, device packages can be designed to introduce signals and power to the devices, remove heat from the devices, physically support the devices, and protect the devices from the environment. Electronic packages also redistribute the dense input/output (I/O) connections on the devices to the I/O connections on a higher level interconnect structure such as a circuit board.

One type of device package is a pin grid array package. A typical pin grid array package includes a device module. In a typical conventional device module, one or more devices are attached to a ceramic circuit structure. Solder joints can be used to couple the devices to the ceramic circuit structure. Pins attached to the ceramic circuit structure permit the package to be physically coupled and uncoupled to and from the circuit board. For instance, the package can be physically coupled or uncoupled to and from the circuit board by inserting or withdrawing the pins from the circuit board apertures, thus permitting relatively easy replacement of the package if desired.

Although pin grid array packages are desirable, conventional pin grid array package modules and the methods for forming the modules could be improved. For example, the thermal mismatch between a device and a ceramic circuit structure in a package can sometimes cause solder joints disposed between the device and the ceramic circuit structure to fail. The repeated on-off cycling of the device during its lifetime causes it to repeatedly expand and contract relative to the ceramic circuit structure. This can sometimes cause solder joints between the device and ceramic circuit structure to break over time. Moreover, ceramic circuit structures are relatively difficult and expensive to make.

Accordingly, it would be desirable to provide for improved device modules, which are less expensive and less difficult to make.

SUMMARY OF THE INVENTION

Embodiments of the invention are directed to device modules and methods for making device modules suitable for use in a pin grid array package.

One embodiment of the invention is directed to a method comprising: forming a polymeric circuit structure having a first side and a second side on a substrate, wherein the first side is adjacent to the substrate; bonding a pin to the second side of the polymeric circuit structure; removing at least a portion of the substrate to expose at least a portion of the first side of the polymeric circuit structure; and mounting a device on the first side of the polymeric circuit structure.

Another embodiment of the invention is directed to a method comprising: forming a polymeric circuit structure having a first side and a second side on a substrate, wherein the polymeric circuit structure includes a first conductive region at the first side and a second conductive region at the second side, and the first side is adjacent to the substrate; aligning an aperture in a rigid body with the second conductive region; removing at least a portion of the substrate to expose at least a portion of the first side of the polymeric circuit structure; depositing a conductive material within the aperture to form a conductive via structure, the conductive via structure having a first end proximate to the second conductive region and a second end distal to the second conductive region; and bonding a pin to the second end of the conductive via structure.

Another embodiment of the invention is directed to a device module comprising: a polymeric circuit structure having a first side comprising a first conductive region and a second side having a second conductive region; a device on the first conductive region; a pin bonded to the second conductive region, and disposed opposite the device on the first conductive region; and a rigid board having an aperture, wherein the pin passes through the aperture and opposite ends of the pin are disposed outside of the aperture.

These and other embodiments are described with reference to the foregoing Figures and Detailed Description.

BRIEF DESCRIPTION OF THE DRAWINGS

FIG. 1(*a*) is a cross-sectional view of a device module having pins and devices on one side on the module.

FIG. 1(*b*) is a plan view of the device module shown in FIG. 1(*a*).

FIG. 2(*a*) is a cross-sectional view of a device module having pins and devices on opposite sides of the module.

FIG. 2(*b*) is a plan view of the device module shown in FIG. 2(*a*), with the devices being shown by invisible lines.

FIGS. 3(*a*)–3(*c*) are cross-sectional views of structures used in the formation of a device module.

FIG. 3(*d*) is a cross-sectional view of a device module.

FIG. 3(*e*) is a plan view of a device module shown in FIG. 3(*d*), with the devices being shown by invisible lines.

FIG. 4(*a*) is a cross-sectional view of an array of pins.

FIGS. 4(*b*) to 4(*d*) are cross-sectional views of pins.

FIG. 5(*a*) is a cross-section of a device module.

FIG. 5(*b*) is a plan view of a rigid board.

FIGS. 5(*c*) and 5(*d*) are close up cross-sectional views of device module portions.

FIG. 5(*e*) is a cross-section of a device module having pins with collars.

FIGS. 6(*a*) to 6(*e*) are cross-sectional views of structures used in the formation of a device module.

These, and other embodiments of the invention are described in further detail below. For clarity of illustration, some drawings may not be to scale.

DETAILED DESCRIPTION

A device module according to an embodiment of the invention can include one or more passive or active devices (e.g., semiconductor or optical chips) disposed on a polymeric circuit structure. The polymeric circuit structure typically includes one or more dielectric polymeric layers and one or more conductive layers. Pins are electrically coupled to one or more conductive regions on the polymeric circuit structure and communicate with the devices through the polymeric circuit structure. The pins can be inserted and withdrawn from apertures in, e.g., a circuit board to couple the device to, and uncouple the device from, the circuit board. In preferred embodiments, the device module can be a single chip module (SCM) or a multichip module (MCM).

The devices and pins in a device module can be arranged in a variety of ways. For example, the devices and pins may be present on the same side of a circuit structure such as a polymeric circuit structure. FIGS. 1(a) and 1(b), for example, show an example of a module 10 having devices 11 and pins 12 disposed on the same side of a polymeric circuit structure 13. The polymeric circuit structure 13 is disposed on top of a supporting body 14.

In preferred embodiments of the invention, a majority of the pins and a majority of the devices in a module are disposed on opposite sides of a polymeric circuit structure. For example, all of the pins in a module can be disposed on one side of a polymeric circuit structure, while all of the devices in the module can be disposed on the other side of the module. FIGS. 2(a) and 2(b), for example, show an example of a module 20 having devices 21 and pins 22 disposed on opposite sides of a polymeric circuit structure 23. A rigid board 24 is disposed between the polymeric circuit structure 23 and the pins 22. A plurality of via structures 26 can be present in a rigid board 24 to communicate the pins 22 and the polymeric circuit structure 23. The conductive via structures 26 pass through the rigid board 24 and electrically couple the pins 22 and the devices 21. In other embodiments, pins can be bonded directly to a polymeric circuit structure. The pins can pass through apertures in a rigid board without using conductive via structures. In these embodiments, opposite ends of the pins can extend past opposing surfaces of the rigid board.

Modules having pins on one side of a circuit structure and devices on the other side of the circuit structure are more desirable than modules having pins and devices disposed on the same side of a circuit structure. First, a greater number of pins and devices can be provided in a module if the pins and devices are on opposite sides of a circuit structure. For example, in the module 10 shown in FIGS. 1(a) and 1(b) the pins 11 and devices 12 are shown as being only on one side of the circuit structure 13. By comparison, in the module 20 shown mil FIGS. 2(a) and 2(b), devices 21 (shown in invisible lines) and pins 22 can be disposed on both sides of the polymeric circuit structure 23 Pins 22 and devices 21 can be disposed across the opposing faces of the polymeric circuit structure 23, and Fe placement of the pins 22 is not limited to the peripheral face of the polymeric circuit structure 23. Consequently, a greater number of pins and devices per module can be provided in less space when the pins and devices are disposed on opposite sides of the module. Second, cooling elements (e.g., heat sinks) having any suitable height can be disposed on the devices when the pins are on the opposite side of a circuit structure. Illustratively, when coupling a module to a circuit board, the pins are inserted into apertures in the circuit board (not shown). If the pins and devices in the module are on the same side of the circuit structure, the coupled circuit board is disposed over the devices, and can limit the heights of heat sinks attached to the devices. On the other hand, in the module 20 shown in FIGS. 2(a) and 2(b), pins 22 and devices 21 are disposed on opposite sides of the polymeric circuit structure 23. A circuit board cooperatively arranged with the pins 22 is not disposed over the devices 21. Consequently, any suitable cooling element having any suitable height can be attached to the top of the devices 21. Third, the length of the circuit pathways between the devices (and consequently the gates in the devices) and the pins can be shorter when the devices and pins are disposed on opposite sides of the polymeric circuit structure. The shorter circuit pathways permit signals and power to be transferred between the devices and the pins more quickly, thus permitting potentially faster operation in a computer. For example, in the module 10 shown in FIGS. 1(a) and 1(b), electrical signals may pass from the devices 11 to the pins 12 at the periphery of the module 10 horizontally through the polymeric circuit structure 13. However, in the module 20 shown in FIGS. 2(a) and 2(b), electrical signals can pass from the devices 21, through the polymeric circuit structure 23 and the rigid board 24, and to the pins 22. The electrical pathway between the devices 21 and the pins 22 in the module 20 shown in FIG. 2 may be substantially vertical and shorter than the horizontal electrical pathways used in the module 10 shown in FIG. 1.

Embodiments for forming modules having a majority of pins and a majority of devices on respective opposite sides of a polymeric circuit structure can be described with reference to some of the remaining Figures. One embodiment of the invention includes forming a polymeric circuit structure having a first side and a second side on a substrate, where the first side is adjacent to the substrate. One or more pins are bonded to the second side of the polymeric circuit structure, and at least a portion of the substrate is removed to expose at least a portion of the first side of the polymeric circuit structure. Devices can then be mounted on the exposed first side of the polymeric circuit structure to form a device module embodiment.

Embodiments of the invention can be described with reference to FIGS. 3(a) to 3(d). As shown in FIG. 3(a), a polymeric circuit structure 33 having a first side 33(a) and a second side 33(b) can be formed on a substrate 35. The first side 33(a) of the polymeric circuit structure 33 is proximate to the substrate 35, while the second side 33(b) of the polymeric circuit structure 33 can be disposed distal to the substrate 35. The first side 33(a) of the polymeric circuit structure 33 can also be adjacent to, and is preferably in direct contact with, a major surface of the substrate 35. Conductive regions (e.g., lines, pads, lands) may be present at the first and second sides 33(a), 33(b) of the polymeric circuit structure. For example, a first conductive region suitable for receiving a device can be at the first side 33(a), while a second conductive region suitable for receiving a pin can be at the second side 33(b).

The substrate can be used to temporarily support the polymeric circuit structure or a polymeric circuit structure precursor. Precursors such as conductive and dielectric layers used to form the polymeric circuit structure are often thin and flimsy. Many polymeric layers, in particular, can warp, bend, or move during processing and/or in response to temperature changes. Among other functions, the substrate supports and maintains the planarity of the precursors during processing so that circuit image distortion in formed circuit patterns is reduced and fine-line structures can be formed in the polymeric circuit structure.

Any suitable substrate may be used in embodiments of the invention. The substrate preferably has at least one smooth planar surface, and may be in the form of a plate, wafer, or panel. In addition, the substrate may comprise any suitable material. For example, the substrate may comprise a metal such as aluminum (Al). molybdenum (Mo), Invar, and Kovar, a ceramic and/or silicon. Preferably, the substrate includes an etchable material, so that the substrate or a portion thereof can be subsequently removed by etching.

The polymeric circuit structure 33 formed on the substrate 35 can be flexible or rigid, and can have any suitable thickness. For example, the polymeric circuit structure 33 can have a thickness of less than about 100 microns. In some embodiments, the thickness of the polymeric circuit structure 33 is between about 50 and about 70 microns. The polymeric circuit structure 33 generally comprises one or more conductive layers and one or more dielectric polymeric layers. The individual conductive layers and/or the polymeric layers may have a thickness of less than about 25 microns.

The conductive layers and dielectric layers used in the polymeric circuit structure may comprise any suitable material. Exemplary polymeric layer materials include polyamides, polyamides, epoxy functional polymers, and bismaleimide-triazine. Preferred polyimides include DuPont PI-2611. Regardless of the particular polymeric material used, the polymeric material preferably includes a coefficient of thermal expansion (CTE) between about 2 to about 9 ppm/° C. Preferably, the polymeric material has a CTE which substantially matches the matexial used in the devices so that any thermal expansion differences between the devices and the polymeric circuit structure are minimized. For example, the polymeric material may have a CTE between about 3 and about 4 ppm/° C., substantially matching the CTE of silicon The conductive layers can include any suitable conductive material including metals such as copper, chromium, aluminum, gold and silver.

The polymeric circuit structure 33 may be formed using any suitable process. For example, the polymeric circuit structure 33 can be formed by any suitable additive, subtractive, or semiadditive process. Coating processes such as electroplating or sputtering can be used to form the conductive layers, while coating processes such as spin coating, doctor blade coating, curtain coating or roller coating can be used to form the polymeric layers. The dielectric polymeric layers or the conductive layers may also be laminated.

As shown in FIG. 3(b), after the polymeric circuit structure 33 is formed, pins 32 are bonded to conductive regions (not shown) at the second side 33(b) of the polymeric circuit structure 33. The pins may be bonded to the conductive regions using any suitable process. Suitable bonding processes include soldering, welding, or brazing. Preferably, the pins 32 are brazed or soldered to conductive regions (e.g., pads) at the second surface 33(b) of the polymeric circuit structure 33 to form metallurgical bonds between the pins and the conductive regions. For example, after brazing or soldering, a metallurgical joint such as a braze or solder joint can contact and join a pin head and a conductive region. In other embodiments, conductive or nonconductive adhesives may also be used to bond the pins to the polymeric circuit structure. Regardless of the particular bonding process used, the pin can remain bonded to the conductive region even when the bonded pin is subjected to a pulling force of about 1 kg or more.

The pins used in embodiments of the invention may have any suitable dimension or geometry. With reference to FIG. 4(a), each pin may include a pin head 32(a) at one end, and a substantially linear body 32(b) having an end region 32(c) at the other end. Typically, the pin head 32(a) is disposed proximate to a conductive region on the polymeric circuit structure, while the end region 32(c) of the pin is disposed distal to the conductive region, and is free. For example, as shown in FIG. 3(b), the pin heads may be bonded directly to conductive regions (not shown) at the second side 33(b) of the polymeric circuit structure 33, while end regions of the pins extend away from the polymeric circuit structure 33. Again, with reference to FIG. 4(a), the pin head 32(a) and/or the pin body 32(b) may have any suitable cross section including a circular or polygonal (e.g., square) cross section. In embodiments of the invention, the pins may have a pin body diameter, d, of about 200 microns or less, a pin head diameter, D, of about 800 microns or less, and a body length, h, of about 4 mm or less. When the pins are in an array, the pins may have any suitable pitch, p, in the module. For example, the average pitch may be about 1500 microns or less (e.g., about 1270 microns or less).

In other embodiments, the pins may include a pin head, and body portions separated by a collar or bent portion. Examples of such pins are shown in FIGS. 4(b) to 4(d). The pins shown in FIGS. 4(b) and 4(c) include a pin head 32(a), body portions 32(e), 32(f), and a collar 32(d) disposed between the body portions 32(e), 32(f). As shown in FIG. 4(b), the collar 32(d) may have a shape substantially similar to that of the pin head 32(a). Alternatively, the collar 32(d) and the pin head 32(a) may be shaped differently as shown in FIG. 4(c). The pin shown in FIG. 4(d) includes a pin head 32(a), and a non-linear pin body including a bent portion 32(g) between two body portions 32(e), 32(f).

The presence of a collar or bent portion on a pin can help the pin remain in an aperture in a structure such as a rigid board or a circuit board. For example, a structure such as a circuit board or rigid board may be secured over a body portion between a pin head, and a collar or bent body portion. The pin head, and the collar or bent portion can restrict the movement of the structure, thus stabilizing the structure in a predetermined position, with or without an additional bonding material (e.g., solder). The pin head and collar, in particular, may have a diameter larger than the diameter of the aperture in which the pin is disposed. Either or both of the pin material or the aperture walls may comprise a deformable material so that the larger collar or pin head can pass through the aperture.

After the polymeric circuit structure is formed, at least a portion of the substrate is removed to expose at least a portion of the first side of the polymeric circuit structure. The exposed inner portion of the first side exposes conductive regions suitable for device mounting. The removal of substrate material may occur before or after the pins are bonded to the polymeric circuit structure.

In some embodiments, the entire substrate can be removed so that the entire first side of the polymeric circuit structure is exposed. In other embodiments, a portion of the substrate may be removed to expose a corresponding portion of the first side of the polymeric circuit structure. With reference to FIG. 3(c), for example, a portion (e.g., an inner portion) of the substrate 33 can be removed to expose a corresponding inner portion of the first side 33(a) of the polymeric circuit structure 33. The portion of the substrate remaining on the polymeric circuit structure 33 may form a frame 37 at the periphery of the polymeric circuit structure 33. The frame 37 may remain as part of the formed module if desired.

The substrate material can be removed by any suitable method. For example, wet or dry etching, milling, and ablation may be used alone or in any suitable combination to remove the desired portion or amount of substrate material. Preferably, the substrate material is removed by etching. Etching processes may include any suitable wet or gas etching process. In an exemplary substrate material removal process, a mask (e.g., a photoresist) can be deposited on the outer peripheral surface (or any other suitable surface) of the substrate opposite the polymeric circuit structure. The uncovered inner portion of the substrate can then be removed by etching, thereby leaving a frame 37 surrounding the exposed portion of the polymeric circuit structure 33.

After the polymeric circuit structure is formed, one or more devices 31 can be mounted on the exposed first side 33(*a*) of the polymeric circuit structure 33. The devices 31 may be mounted on the polymeric circuit structure 33 before or after the pins 32 are bonded to the second side 33(*b*) of the polymeric circuit structure 33. For example, as shown in FIG. 3(*d*), after the substrate material is removed and after the pins 32 are bonded to the second side 33(*b*) of the polymeric circuit structure 33, devices 31 can be mounted to the exposed first side 33(*a*) of the polymeric circuit structure 33.

As shown in FIGS. 3(*d*) and 3(*e*), the mounted devices 31 can be disposed within the frame 37 and on the side of the polymeric circuit structure 33 opposite the pins 32. Since the devices 31 are on the side of the polymeric circuit structure 33 opposite the pins 32, the mounted devices 31 do not significantly inhibit the placement or the number of pins in the module. In some embodiments, the modules may include at least about 2000 pins. In other embodiments, the modules may have at least about 3000 pins.

The devices can be mounted on the polymeric circuit structure using any suitable process. For example, devices having a plurality of solder bumps or conductive posts can be mounted so that the solder bumps or conductive posts are disposed between, and electrically couple, the polymeric circuit structure and the devices. Preferably, the devices are mounted on the polymeric circuit structure using a flip chip mounting process. A typical flip chip mounting process includes depositing solder bumps on a chip, flipping the chip over, aligning and contacting the solder bumps with conductive regions (e.g., pads) on the polymeric circuit, structure, and then reflowing the solder bumps to establish an electrical connection between the chip and the polymeric circuit structure.

Once formed, the module 30 may be mounted to any suitable structure. For example, the module 30 can be coupled to a circuit board, by inserting the pins 22 into apertures in the circuit board. Typically, the apertures in the circuit board contain a conductive material, such as solder, to electrically couple the module and the circuit board. The apertures in the circuit board may also include a number of ZIF (zero insertion force) sockets if desired.

Preferred modules according to embodiments of the invention include a rigid board with apertures. An example of this type of module is shown in FIG. 5(*a*). The module 40 includes a polymeric circuit structure 33 having a first side comprising a first conductive region (not shown) and a second side having a second conductive region (not shown). A pin 32 having a pin head and a body portion is bonded to the second conductive region. The pin head is proximate to the second conductive region and the pin body is distal to the second conductive region. A rigid board 38 is disposed proximate to the second side of the polymeric circuit structure 33, and has an aperture through which the pin 32 passes. A device 31 is mounted within a frame 37 and to the first conductive region at the first side of the polymeric circuit structure 33 opposite the pin 32.

Typically, the rigid board is adjacent to (e.g., in direct contact with) the polymeric circuit structure. The pins bonded to the polymeric circuit structure are inserted into the apertures of the rigid board so that respective portions of the pin bodies are disposed within the apertures. The pin heads and the end portions of the pin bodies are normally outside of the apertures. For example, a pin head and a body end portion can extend past and be outside of opposing surfaces of the rigid board.

In addition to providing structural support for the module components, the rigid board facilitates easier mounting and demounting of the module. For example, when inserting or removing the module into, e.g., a circuit board, force can be applied to the rigid board, instead of the polymeric circuit structure or the pins. By applying force to the rigid board to insert and remove a module from a structure such as a circuit board, less stress is applied to the pins and the polymeric circuit structure, thus decreasing the likelihood that these components will break, bend, or tear when mounting or demounting the module.

When the pins are disposed within the apertures of the rigid board, they can be electrically isolated from each other. For example, the pin bodies can be coated with an insulating material so that when the coated pin bodies contact the aperture side-walls of the rigid board, electrical contact between the board and the pin bodies does not take place. In another example, the aperture sidewalls are nonconductive, so that each of the pins are electrically isolated from each other when they are disposed in the apertures. In some embodiments, the rigid board may consist entirely of insulating material.

An example of a rigid board 38 is shown in FIG. 5(*b*). The rigid board 38 in FIG. 5(*b*) includes a solid body 41, and a plurality of apertures 42 which can receive a plurality of pins. The diameter of each aperture 42 may be slightly larger than the diameter of the body of the pins. Typically, the diameter of an aperture is about 200 microns or less. While the apertures 42 are shown in a regular array to accept pins arranged in a corresponding regular array, the apertures 42 can also be in an irregular array.

Preferably, at least one major surface of the rigid board is unpolished and/or uncircuitized (e.g., without photo-defined circuit patterns). Using an unpolished and/or uncircuitized rigid board in a module can reduce the overall cost of the module. For example, if a polymeric circuit structure is formed directly on a rigid board such as a ceramic board, the surface of the ceramic board is normally polished before the circuit structure is formed. For instance, in a typical process of making a ceramic board, a plurality of ceramic particles are molded into a green sheet. The green sheet is then fired at high temperature to fuse the ceramic particles together to form a ceramic board. The resulting ceramic board surface can be uneven as the fused particles form asperities at the surface. The uneven surface is typically polished flat so that a polymeric circuit structure can be formed on the flat surface. If polymeric circuit structure precursors are uneven during processing, the circuit images formed in the polymeric circuit structure may be distorted. In embodiments of the invention, however, the polymeric circuit structure can be formed independent of the rigid board (e.g., on the previously described substrate). Consequently, the rigid board used in the module may have an unpolished surface and may still provide suitable structural stability for the polymeric circuit structure, pins, and devices in the module. Consequently, a wide variety of rigid board materials can be used in the device module, and the device module can be formed in a cost efficient manner.

The rigid board can be formed in any suitable manner. Apertures can be formed in a non-apertured board using any suitable process including laser drilling, etching, and punching. In one example, a non-apertured conductive body can be coated with an insulating material such as polyimide or polytetrafluoroethylene. Holes can then be drilled in the coated body to form a rigid board with apertures. In another example, a non-apertured green sheet can be formed by molding a mass of ceramic particles and a binder into a green sheet. Apertures can then be formed in the green sheet using any suitable method. Later, the apertured green sheet can be fired to form a rigid ceramic board with apertures.

The rigid board may include any suitable material. Suitable rigid board materials include polymeric materials such as polyimide and bismaleimide-triazine (BT) resins, high temperature fired ceramic materials including alumina and aluminum nitride, and metals such as Invar, Kovar, and molybdenum. Regardless of the particular material chosen for the rigid board, the rigid board preferably includes materials which have a melting point of greater than about 350° C. Although the rigid board may include any suitable CTE, the CTE of the rigid board is preferably about 10 ppm/° C. or less.

Once the rigid board is formed, the pins on the polymeric circuit structure can be partially or fully inserted into the apertures of the rigid board, so that the polymeric circuit structure is adjacent to, or is spaced from, the rigid board. For example, as shown in FIG. 5(c), the pins 32 can be fully inserted to the apertures in the rigid board 38, so that the polymeric circuit structure 33 is closely adjacent to the rigid board 38, and the pin heads are in contact with the rigid board 38. The body of the pins pass through the apertures so that the pin heads and the end regions of the body portions extend outwardly from the opposing surfaces of the rigid board 38. In these embodiments, the rigid board materials preferably have a CTE of about 9 ppm/° C. or less.

In other embodiments, the pins may be partially inserted into the apertures of the rigid board so that the polymeric circuit structure and the pin heads are spaced from the rigid board. In these embodiments, any devices on the polymeric circuit structure are also spaced from the rigid board. For example, as shown in FIG. 5(d), the pins 32 may be inserted into the rigid board 38 so that the pin heads and the polymeric circuit structure 33 are spaced from the rigid board 38. As shown in FIG. 5(d), the bodies of the pins can be linear. In another example, as shown in FIG. 5(e), the pins 32 bonded to the polymeric circuit structure 33 can have a pin head and a collar spaced from the pin head. The pin head may be bonded to the polymeric circuit structure 33, while the collar rests against the rigid board 38. Devices 31 disposed on the polymeric circuit structure 33 and within a frame 37 are spaced from the rigid board 38. Spacing the devices from the rigid board can be desirable. For example, increasing the stand off between the devices and the rigid board permits the devices to move (e.g., expand and contract) more freely, relative to the rigid board, thus decreasing the likelihood that structures between the rigid board and the devices may fail. In these embodiments, the rigid board may include materials having a CTE of about 10 ppm/° C. or more.

After the pins are inserted into the apertures of the rigid board, any desired portion (e.g., a body portion) of the pins may be bonded to the rigid board. Bonding materials such as epoxy and polyimide adhesives can be used to bond the pins to the aperture side walls of the rigid board to stabilize the pins. In some embodiments, a metallic bond can be formed between the aperture walls and the pins. For example, the aperture walls in a rigid board can be coated with a metallic material including a metal such as Ti/Cu or electroless copper. Pins can be inserted into the apertures and the structure can be heated to form an intermetallic bond between the metallic material and the pins.

Other embodiments of the invention are directed to methods comprising: forming a polymeric circuit structure having a first side and a second side on a substrate, wherein the polymeric circuit structure includes a first conductive region at the first side and a second conductive region at the second side, and the first side is adjacent to the substrate; aligning an aperture in a rigid body with the second conductive region; removing at least a portion of the substrate to expose at least a portion of the first side of the polymeric circuit structure; depositing a conductive paste within the aperture to form a conductive via structure, the structure having a first end proximate to the second conductive region and a second end distal to the second conductive region; and bonding a pin to the second end of the conductive via structure. These embodiments can be described with reference to FIGS. 6(a) to 6(e).

In FIG. 6(a), a polymeric circuit structure 53 can be formed on a substrate 54. As shown in FIG. 6(a), the polymeric circuit structure 53 may have a first side adjacent to the substrate 54, and a second side opposite the substrate 54. The first side can have a plurality of first conductive regions (not shown) and the second side can have a plurality of second conductive regions 59. The polymeric circuit structure 53 can be formed using any suitable process or material including those previously discussed with respect to other embodiments. The polymeric circuit structure 53 may have any suitable dimensions or materials including those discussed with respect to the previously described embodiments.

With reference to FIGS. 6(b) and 6(c), a rigid board 50 having a plurality of apertures 57 is then aligned with the second conductive regions 59 so that the apertures 57 are respectively disposed over the plurality of second conductive regions 59. The apertures 57 may be aligned manually or automatically, and the rigid board 50 may have the same of different characteristics as the previously described rigid board. Once aligned, the rigid board 50 can be bonded to the polymeric circuit structures 53. Any suitable bonding process (e.g., adhesive bonding) can be used.

A conductive material is deposited into the apertures of the rigid board 50. As shown in FIG. 6(d), a conductive material 61 can be deposited into the apertures 57 and onto the second conductive regions 59. In preferred embodiments, the conductive material 61 is a conductive paste such as solder paste. The conductive material 61 can be screened or dispensed into the apertures 57 of the rigid board 50. After being deposited, the conductive material 61 may be cured or reflowed if desired. In other embodiments, the conductive material 61 can be electroplated within the apertures. As shown in FIG. 6(e), the deposited conductive material 61 can be in the form of a via structure 64 having a first end and a second end, where the first end is proximate to the second conductive region and the second end is distal to the second conductive region 59.

Prior to or after the conductive material 61 is deposited into the apertures or prior to or after aligning the rigid board apertures with the second conductive regions, at least a portion of the substrate 54 can be removed. This can be done in the same or different manner as the previously described embodiments. For example, as shown in FIG. 6(d), the entire substrate can be removed. In other embodiments, a portion (e.g., an inner portion) of the substrate material can be removed to expose a corresponding portion of the first side of the polymeric circuit structure 53.

Once the conductive material 61 is deposited into the apertures, pins 52 can then be bonded to the second ends of the via structures 64. The pins 52 may have the same or different characteristics as the previously described embodiments, and may be bonded to the second ends of the via structures 64 using any suitable process including soldering, welding, and brazing. As shown in FIG. 6(e), the pin heads are joined to the second ends of the via structures so that the pins 52 electrically communicate with the polymeric circuit structure 53 through the second conductive regions 59 and the via structures 64.

One or more devices 51 may be mounted to the exposed first side of the polymeric circuit structure 53 in the same or different manner as in the previously described embodiments. The devices 51 shown in FIG. 6(*e*), for example, can be mounted before or after the pins 52 are bonded to the second ends of the via structures 64.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention.

What is claimed is:

1. A method comprising:
   forming a polymeric circuit structure having a first side and a second side on a substrate, wherein the first side is adjacent to the substrate;
   bonding a pin to the second side of the polymeric circuit structure;
   removing at least a portion of the substrate to expose at least portion of the first side of the polymeric circuit structure; and
   mounting a device on the first side of the polymeric circuit structure.

2. The method of claim 1, wherein the polymeric circuit structure comprises a plurality of polymeric layers and conductive layers, each of the polymeric layers and the conductive layers having a thickness of less than about 25 microns.

3. The method of claim 1 wherein bonding a pin to the second side of the polymeric circuit structure comprises brazing the pin to the second side of the polymeric circuit structure.

4. The method of claim 1 wherein removing at least a portion of the substrate comprises etching.

5. The method of claim 1 further comprising:
   inserting the bonded pin into an aperture in a rigid body.

6. The method of claim 5 further comprising bonding the pin to sidewalls of the aperture.

7. The method of claim 1 wherein the substrate comprises aluminum or silicon.

8. The method of claim 1 wherein removing at least a portion of the substrate comprises removing an inner portion of the substrate.

9. The method of claim 1 wherein mounting the device comprises mounting the device by a flip chip bonding process.

10. A method comprising:
    forming a polymeric circuit structure having a first side and a second side on a substrate, wherein the polymeric circuit structure includes a first conductive region at the first side and a second conductive region at the second side, and the first side is adjacent to the substrate;
    aligning an aperture in a rigid body with the second conductive region;
    removing at least a portion of the substrate to expose at least a portion of the first side of the polymeric circuit structure including the first conductive region;
    depositing a conductive material within the aperture to form a conductive via structure, the conductive via structure having a first end proximate to the second conductive region and a second end distal to the second conductive region; and
    bonding a pin to the second end of the conductive via structure.

11. The method of claim 10 further comprising, after removing at least a portion of the substrate:
    mounting a device to the exposed first conductive region.

12. The method of claim 10 wherein depositing a conductive material within the aperture includes screening the conductive material within the aperture.

13. The method of claim 10 wherein removing at least a portion of the substrate comprises removing the entire substrate.

14. The method of claim 10 wherein bonding a pin to the second end of the conductive via structure comprises bonding a head of the pin to the second end of the conductive via structure.

15. The method of claim 10 wherein bonding the pin to the second end of the conductive via structure occurs after removing at least a portion of the substrate.

16. The method of claim 10 wherein bonding the pin to the second end of the conductive via structure occurs before removing at least a portion of the substrate.

* * * * *